United States Patent
Kasten et al.

(10) Patent No.: US 7,235,975 B2
(45) Date of Patent: Jun. 26, 2007

(54) MAGNET SYSTEM WITH SHIELDED REGENERATOR HOUSING

(75) Inventors: Arne Kasten, Karlsruhe (DE); Michael Westphal, Offenbach (DE)

(73) Assignee: Bruker Biospin GmbH, Rheinstetten (DE)

( * ) Notice: Subject to any disclaimer, the term of this patent is extended or adjusted under 35 U.S.C. 154(b) by 0 days.

(21) Appl. No.: 11/115,166

(22) Filed: Apr. 27, 2005

(65) Prior Publication Data

US 2005/0253583 A1    Nov. 17, 2005

(30) Foreign Application Priority Data

May 11, 2004   (DE) ...................... 10 2004 023 073

(51) Int. Cl.
*G01V 3/00* (2006.01)
(52) U.S. Cl. ...................................... 324/319; 324/318
(58) Field of Classification Search ................ 324/318, 324/319, 322, 309, 307, 300, 320; 335/216, 335/299, 296, 301; 62/47.1, 51.1; 128/653.5
See application file for complete search history.

(56) References Cited

U.S. PATENT DOCUMENTS

| | | | |
|---|---|---|---|
| 4,535,595 A | | 8/1985 | Keller |
| 5,258,573 A | * | 11/1993 | Sugioka et al. ............. 505/211 |
| 5,278,503 A | * | 1/1994 | Keller et al. ................ 324/318 |
| 5,701,744 A | | 12/1997 | Eckels |
| 6,029,458 A | | 2/2000 | Eckels |
| 6,476,700 B2 | * | 11/2002 | Schauwecker et al. ...... 335/216 |
| 7,005,953 B2 | * | 2/2006 | Bovier et al. ............... 335/301 |
| 2001/0025494 A1 | | 10/2001 | Okamura |
| 2005/0110602 A1 | * | 5/2005 | Westphal .................... 335/301 |

\* cited by examiner

*Primary Examiner*—Brij B Shrivastav
(74) *Attorney, Agent, or Firm*—Paul Vincent

(57) ABSTRACT

A magnet system of a magnetic resonance apparatus for generating a magnetic field which is homogeneous and temporally highly stable within a volume under investigation and which extends along a z-axis, with a superconducting magnet coil (3) which is disposed in a cryostat (1) and with a periodically operated refrigerator (2) having a magnetic regenerator material which is disposed in a regenerator housing (5) within the cryostat (1) in the stray field of the magnet coil (3), and which is provided with a device (4) for shielding or compensating a magnetic disturbing field in the volume under investigation generated by the periodic operation of the refrigerator (2) due to regenerator magnetization changes is characterized in that the regenerator housing (5) is surrounded by a compensation coil arrangement (4) which can be superconductingly short-circuited and which is made from a plurality of conductor loops (6, 7a, 7b) which are separately short-circuited during measurement to keep a plurality of magnetic fluxes through these conductor loops (6, 7a, 7b) constant in the superconductingly short-circuited state. A magnet system of this type facilitates effective compensation of the disturbing fields caused by a magnetic regenerator material at the location of the volume under investigation.

18 Claims, 3 Drawing Sheets

MAGNET SYSTEM WITH SHIELDED REGENERATOR HOUSING

This application claims Paris Convention priority of DE 10 2004 023 073.0 filed May 11, 2004 the complete disclosure of which is hereby incorporated by reference.

BACKGROUND OF THE INVENTION

The invention concerns a magnet system in a magnetic resonance apparatus for generating a magnetic field which is homogeneous and temporally highly stable within a volume under investigation and extends along a z-axis, with a superconducting magnet coil which is disposed in a cryostat and with a periodically operated refrigerator having magnetic regenerator material which is disposed in a regenerator housing within the cryostat in the stray field of the magnet coil, and which is provided with a device for shielding or compensating a magnetic disturbing field in the volume under investigation generated by periodic operation of the refrigerator through changes in the regenerator magnetization.

U.S. Pat. No. 4,535,595 discloses detection of the magnetic disturbances of a motor-driven piston refrigerator using a sensor means, wherein the sensor means controls a coil for compensation of the disturbing field acting in the sample volume. A detector coil disposed in the region of the refrigerator or in the sample volume serves as sensor means. The signals are guided via an electronic control device to a compensation coil surrounding the sample volume. An arrangement of this type does not, however, provide optimum compensation of the disturbances. Another disadvantage is the need for additional electronic devices.

In contrast thereto, pulse tube coolers effect expansion and compression of a working gas by a shock wave front in a pulse tube.

In addition to piston refrigerators, pulse tube coolers have been used to an increasing extent as refrigerators, wherein expansion or compression of the working gas is effected using a shock wave front. After compression, the working gas flows through a regenerator and is relaxed in an expansion chamber with associated heat exchange between the working gas and the regenerator material. Regenerator materials with phase transitions are generally used to effect this heat exchange at minimum temperatures. The phase transition increases the specific heat of the regenerator material and permits cooling of the working gas to less than 3 K. The materials which are conventionally used for this purpose have a magnetic phase transition which can, however, produce considerable disturbances in the main magnetic field in the volume under investigation.

U.S. Pat. No. 6,029,458 discloses a magnet arrangement with a cryocooler which comprises regenerator materials having a magnetic phase transition. The disturbing fields generated by the magnetic phase transition of the regenerator material are shielded by a superconducting sleeve which surrounds the refrigerator and which is disposed between the cold end of the refrigerator and the volume under investigation. The superconducting sleeve surrounds 90° to 270° of the cold end of the refrigerator and contains one or more layers of superconducting material, preferably NbTi. The magnetic disturbing field of the regenerator material induces a magnetic field in the sleeve which is opposite to the disturbing field and keeps the magnetic flux through the sleeve constant, thereby compensating for the disturbing field. The use of such superconducting sleeves is problematic, since they also interact with the magnetic field of the main magnet. The superconducting material which is used is layered and has transverse dimensions of some centimeters. These layers tend to be instable due to the disturbing field of the regenerator material or the main field magnet, and quenches can occur. For this reason, reliable and stable shielding is not possible in practice. The current distributions in superconducting materials tend to be theoretically instable for transverse dimensions of the superconducting materials of more than approximately 0.1 mm. Instabilities are also expected for layered superconducting materials with transverse dimensions of more than approximately 10 mm.

It is the object of the invention to propose a stable shielding device for the above-described magnet system which compensates for the disturbing fields caused by a magnetic regenerator material at the location of the volume under investigation in a simple fashion.

SUMMARY OF THE INVENTION

This object is achieved in accordance with the invention in that the regenerator housing is surrounded by a compensation coil arrangement which can be superconductingly short-circuited and which is made from a plurality of conductor loops which are separately short-circuited during measurement to keep a plurality of magnetic fluxes through these conductor loops constant in the superconductingly short-circuited state.

Changes in the magnetic field, e.g. through superposition of a periodically changing magnetic disturbing field caused by magnetic regenerator material onto the main magnetic field induce currents in the conductor loops which generate a magnetic field opposite to the disturbing field to prevent conductor loop flux changes. Short-circuiting of the conductor loops freezes the magnetic flux through the respective conductor loops. The arrangement of many separately short-circuited conductor loops permits freezing of different magnetic fluxes in each conductor loop to permit highly precise compensation of disturbing fields in a locally varying magnetic field or locally varying disturbing fields to obtain an overall effective compensation of the disturbing field caused by the regenerator material.

The danger of a quench and hence also the stability of a coil arrangement increase with increasing transverse dimensions of the superconducting material. A shielding or compensation device in accordance with the present invention in the form of conductor loops whose extension can be suitably selected therefore represents a simple means to provide stable compensation of disturbing fields or stable shielding of the volume under investigation from a disturbing field caused by a refrigerator having a magnetic regenerator material.

In a preferred embodiment of the invention, the regenerator housing has a cylindrical shape and at least part of the conductor loops are disposed along the cylinder axis surrounding the regenerator housing. A regenerator housing conventionally has a cylindrical shape. For this reason, the shielding or compensation device is advantageously adapted to this shape.

In a particularly preferred embodiment, the conductor loops form a three-dimensional cage which surrounds the regenerator housing, wherein the surface normals of several conductor loops are not parallel. The conductor loops can therefore completely enclose the regenerator housing to permit three-dimensional compensation of the disturbing field.

In a particularly advantageous manner, the conductor loops of the shielding or compensation coil arrangement can be closed and opened via one or more superconducting switches which can be commonly heated.

In this manner, the conductor loops can be short-circuited e.g. after charging the magnet coil which generates the main field, such that the field generated by the magnet coil can penetrate into the cage formed by the conductor loops. This is advantageous in that charging does not induce large currents in the shielding and compensation coil arrangement, which could impair e.g. the homogeneity of the magnetic field to be generated by the main field coil in the working volume. The superconducting switches of the present device need not be perfectly short-circuited and may have a certain residual resistance provided that the time constant of the conductor loops is large compared to the operational period of the regenerator.

In one particularly preferred embodiment of the inventive magnet system, one side or both sides of the shielding or compensation coil arrangement is/are in contact with a sheet having good thermal conducting properties, in particular, a copper sheet. The sheet having good thermal conducting properties advantageously provides additional thermal stabilization of the shielding and compensation coil arrangement which can be superconductingly short-circuited. It also offers the possibility of thermally connecting the sheet having good thermal conducting properties to the coldest part of the refrigerator thereby keeping the overall shielding and compensation coil arrangement sufficiently cold to maintain the superconducting state. The shielding or compensation coil arrangement can also be heated through the conducting sheet to obtain e.g. a desired current-less state. This is desired e.g. during charging of the magnet coil which generates the main field to prevent current increases within the conductor loops. The sheet having good thermal conducting properties can thereby perform the function of the above described superconducting switches, which is particularly advantageous if the shielding or compensation coil arrangement has a large number of conductor loops, since, in this case, closing the individual switches would be difficult or costly.

In a further embodiment of the inventive magnet system, the shielding or compensation coil arrangement and the sheet having good thermal conducting properties are thermally insulated from the regenerator housing and/or surrounding helium gas, thereby preventing thermal short-circuit of the metallic parts of the shielding and compensation coil arrangement at the regenerator housing, in particular, of the sheet having good thermal conducting properties, which would otherwise reduce the thermal efficiency of the refrigerator.

The refrigerator is preferably a pulse tube cooler. The use of a pulse tube cooler as refrigerator obviates moving parts (pistons) in the low-temperature region, thereby realizing a smoothly running and wear-resistant cooling means.

In particular for MR applications, the regenerator material advantageously contains a substance with a magnetic phase transition of less than 30 K, in particular ErNi and/or $Er_3Ni$ and/or HoCu and/or $GdAlO_3$. The magnet system can be cooled down to the low temperatures required for MR applications by using materials with a phase transition in this temperature range.

In a further embodiment, the shielding or compensation coil arrangement is a grid of superconductingly contacted superconducting wires, in particular, of NbTi. The shielding or compensation coil arrangement of this embodiment has a particularly high current carrying capacity.

In another embodiment of the invention, the shielding or compensation coil arrangement is a perforated sheet with superconducting bridges, in particular, of NbTi. The perforated form is not limited to circular holes but may, in principle, have any shape.

The superconducting wires or bridges are preferably thinner than 200 µm, preferably thinner than 100 µm. Since the stability of the shielding or compensation coil arrangement depends on the transverse dimensions of the superconducting material, the above-described dimensioning of the wires or bridges can obviate the planar character of the device, thereby increasing the stability of the shielding or compensation coil arrangement.

In a particularly preferred embodiment, the section of the regenerator housing which contains the regenerator is disposed at a location in the cryostat having a minimum magnetic field during operation, in particular, radially outside of an outer partial shielding coil of the magnet coil. Interaction between the regenerator material and the main magnetic field is thereby minimized and weaker compensation of the disturbing field is sufficient to provide undisturbed operation of the magnet system.

The invention also concerns a method for operating a magnet system of the above-described type, wherein all superconducting switches of the shielding or compensation coil arrangement are initially opened, the magnet coil is charged and short-circuited with its stray field penetrating the conductor loops, and the superconducting switch of the shielding or compensation coil arrangement is then closed to freeze the fluxes through the conductor loops.

The open state of the superconducting switch during charging of the magnet coil generating the main field ensures that the stray field of the magnet coil generating the main field can penetrate through the shielding or compensation coil arrangement. This is desired, since the shielding currents which would otherwise be induced in the conductor loops or bridges as a result of charging if the superconducting switches were already closed, would be very high and would produce an unnecessary, high load on the wires or filaments.

The refrigerator is preferably switched off when the superconducting switches of the shielding or compensation coil arrangement are closed. The conditions during closure of the superconducting switches are thereby stable which eliminates field defects.

In a particularly preferred variant of the inventive method, the regenerator material is at an increased temperature level compared to its operating temperature when the superconducting switches of the shielding or compensation coil arrangement are closed, thereby reducing its magnetization. This may be effected e.g. through heating of the regenerator. The integral magnetization of the regenerator material thereby reduced due to the increased temperature, is thereby "frozen" when the superconducting switches are closed.

An overall magnet system is obtained which provides effective and reliable shielding of disturbing fields caused by magnetic regenerator materials. In this manner, magnet systems can be realized with optimum utilization of the advantages of pulse tube coolers.

Further advantages of the invention can be extracted from the description and the drawing. The features mentioned above and below may be used individually or collectively in arbitrary combination. The embodiments shown and described are not to be understood as exhaustive enumerations but have exemplary character for describing the invention.

DESCRIPTION OF THE PREFERRED EMBODIMENT

Figure 1:
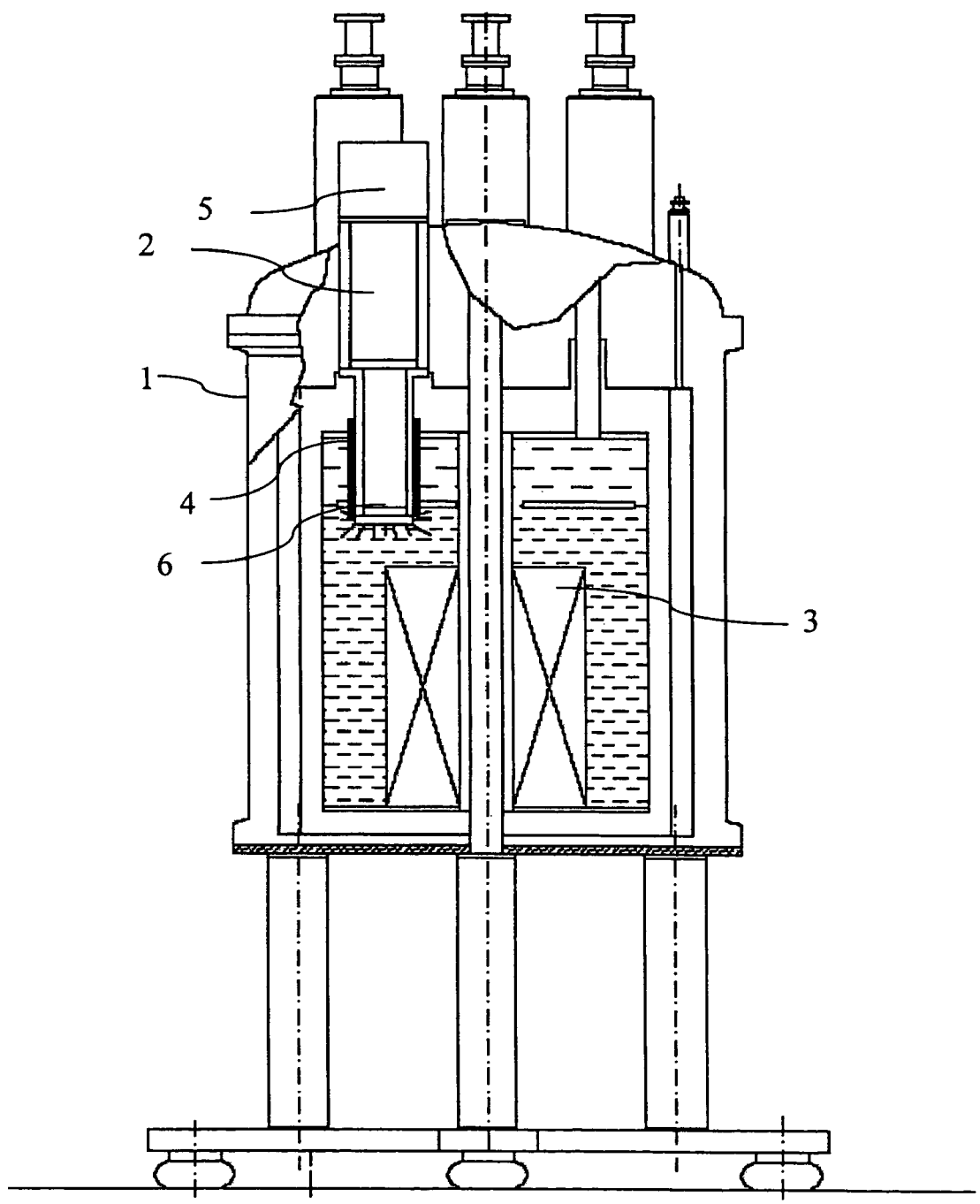
FIG. 1 shows an inventive magnet system.

FIG. 1 shows an inventive magnet system for generating a highly homogeneous magnetic field with a magnet coil 3 disposed in a cryostat 1. The cryostat 1 contains helium which is cooled to a temperature of considerably less than 4 K using a pulse tube cooler 2. The pulse tube cooler 2 is provided with a shielding or compensation coil arrangement 4 which shields or compensates disturbances caused by the regenerator material of the pulse tube cooler 2. The disturbances of pulse tube coolers are mainly generated by remagnetization processes in the regenerator material. For this reason, it is sufficient to merely dispose the shielding or compensation coil arrangement 4 about the regenerator housing 4 portion which contains the regenerator material. One may, however, also dispose the shielding or compensation coil arrangement 4 around the pulse tube, as is of particular interest if regenerator and pulse tube are coaxially disposed.

Figure 2:
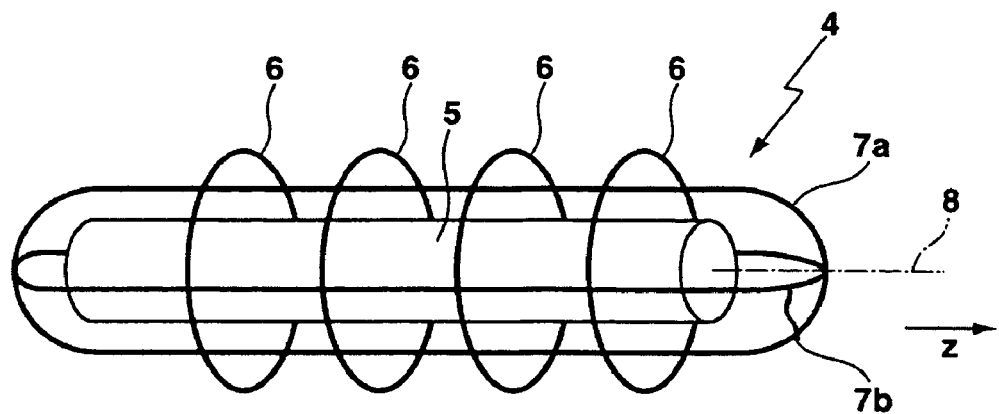
FIG. 2 shows a first embodiment of a shielding or compensation coil arrangement which consists of individual conductor loops.

FIG. 2 shows a regenerator housing 5 which is surrounded by a shielding or compensation coil arrangement 4. The shielding or compensation coil arrangement 4 comprises individual, mutually insulated conductor loops 6, 7a, 7b of superconducting material which can be short-circuited. Instead of being made from superconducting material, the conductor loops 6, 7a, 7b may also be slightly resistive, as long as the time constant of the conductor loops is large compared to the operational period of the regenerator. The conductor loops 6, 7a, 7b are disposed in a cylindrical geometry corresponding to the shape of the regenerator housing 5. Several conductor loops 6 are thereby disposed along the symmetry axis 8 of the regenerator housing 5 such that their surface normals extend parallel to the symmetry axis 8 (z-direction). In addition to the conductor loops 6 with surface normals facing in z-direction, further conductor loops 7a, 7b are disposed whose surface normals do not extend parallel to the z-direction. The surface normals of the conductor loops 7a and 7b are linearly independent of each other, thereby providing effective integral flux compensation in all three spatial directions. It is of course possible to provide further conductor loops whose surface normal may represent any linear combination of the surface normals of the conductor loops 6, 7a, 7b. Each conductor loop 6, 7a, 7b is a separate electric circuit. The individual conductor loops 6, 7a, 7b may be insulated or in contact with each other. With the arrangement of a plurality of independent conductor loops 6, 7a, 7b it is possible to keep different fluxes in the respective conductor loops 6, 7a, 7b constant to provide optimum compensation of spatially varying disturbing fields. Each conductor loop 6, 7a, 7b can be provided with a superconducting switch (not shown) to interrupt the electric circuit, if required, or the conductor loops 6, 7a, 7b can have common superconducting switches.

Figure 3:
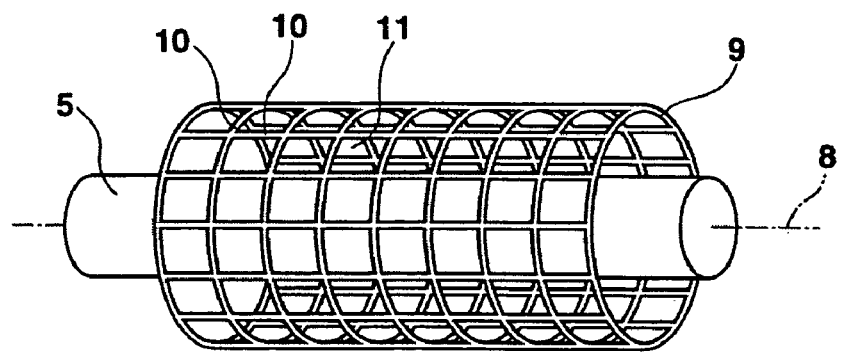
FIG. 3 shows a further embodiment of the shielding or compensation coil arrangement which consists of a perforated sheet with superconducting bridges.

FIG. 3 shows another embodiment of the inventive shielding or compensation coil arrangement 4 in the form of a cylinder surface which is formed by a perforated sheet 9 with superconducting bridges 10. The shape of the recesses 11 in the perforated sheet 9 is square but may, in principle, have any shape. However, the thickness of the bridges 10 is decisive for the shielding efficiency. To permit stable shielding or compensation of the disturbing field generated by the pulse tube cooler 2, the bridges 10 should have a thickness of approximately 100 μm. The embodiment of the shielding or compensation coil arrangement 4 shown in FIG. 3 merely extends over part of the regenerator housing 5, preferably over that part that causes the largest disturbances. This does not preclude the shielding or compensation coil arrangement 4 from extending over the entire length of the regenerator housing 5 or even beyond. In a particularly advantageous manner, the perforated sheet forms a largely closed cage, similar to the conductor loops 6, 7a, 7b of FIG. 2. In addition to an embodiment of the shielding or compensation coil arrangement 4 (FIG. 2) produced from a perforated sheet 9, a similar arrangement can also be realized using crossed filaments.

Figure 4:
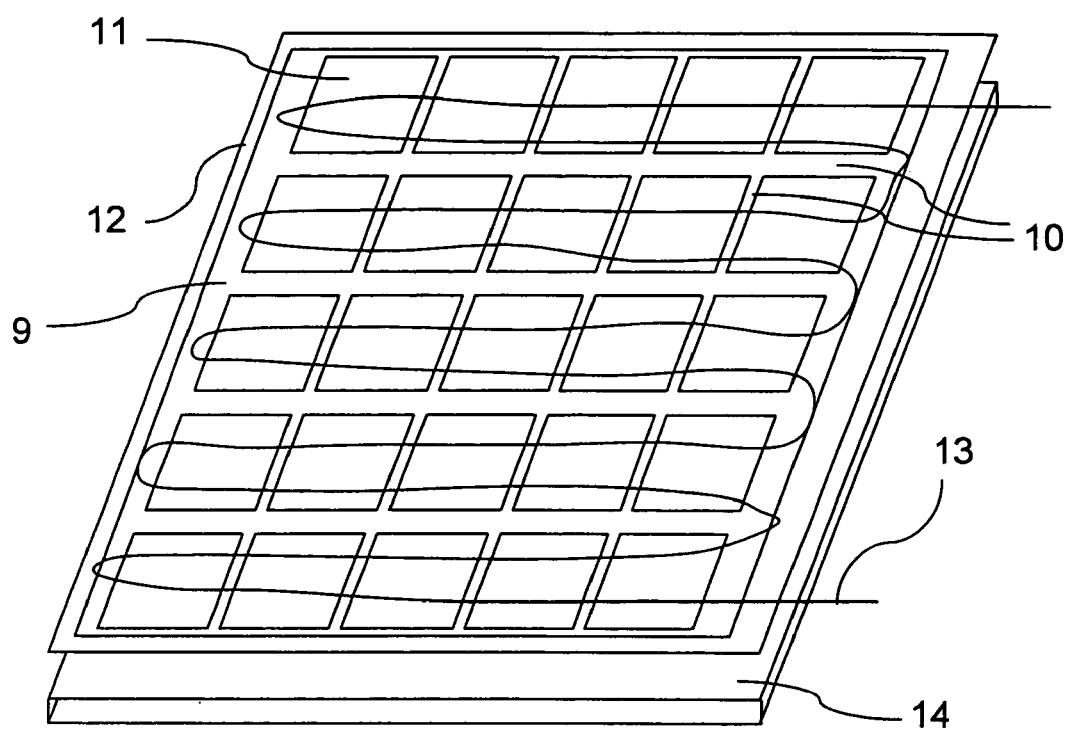
FIG. 4 shows a section of a shielding or compensation coil arrangement of FIG. 3 with a sheet having good thermal conducting properties and an insulation layer.

FIG. 4 shows an enlarged section of the inventive shielding or compensation coil arrangement 4 of FIG. 3. For thermal stabilization, the perforated sheet 9 with superconducting bridges 10 is in contact with a sheet 12 having good thermal conducting properties, e.g. a copper sheet. The low temperature of the shielding or compensation coil arrangement 4 can be realized and kept constant by connecting the sheet 12 having good thermal conducting properties to a cryogenic liquid or to the cold end of the pulse tube cooler 2. The temperature of the shielding or compensation coil arrangement 4 can be increased using an electrically heatable wire 13. Heating of the wire 13 generates heat which can be rapidly guided through the sheet 12 having good thermal conducting properties to all locations of the shielding or compensation coil arrangement to generate a currentless state if required, e.g. during charging of the magnet coil 3. The bridges 10 of the perforated sheet 9 thereby lose their superconducting properties. The electrically heatable wire 13 may therefore assume the function of a switch. The shielding or compensation coil arrangement 4 is moreover provided with a thermal insulating layer 14 which is disposed between the sheet 12 having good thermal conducting properties and the regenerator housing 5. A thermal short-circuit between the regenerator housing 5 and the shielding or compensation coil arrangement 4 is thereby prevented. Without this thermal insulating layer 14, the superconducting bridges 10 could unintentionally lose their superconducting property due to an increase in the temperature of the regenerator housing 5, thereby impairing the shielding or compensation effect. The thermal insulating layer 14 may comprise an insulating material or could be a vacuum layer. To also insulate the shielding or compensation coil arrangement 4 from the elements of the magnet system which surround the shielding or compensation coil arrangement 4, a further insulation layer may be disposed on the side of the perforated sheet 9 opposite the insulation layer 14. The perforated sheet 9 and a sheet 12 having good thermal conducting properties may be in contact on either side thereof.

Due to the inventive shielding or compensation coil arrangement 4, the regenerator material of the pulse tube cooler 2 induces currents in the conductor loops 6, 7a, 7b or bridges 10 of the perforated sheet 9 when the magnetic field changes. These currents generate a magnetic field opposite to the disturbing field such that the magnetic flux through the conductor loops 6, 7a, 7b or through the perforated sheet 9 remains constant, i.e. is frozen. The magnitude of the frozen flux depends on the point in time at which the conductor loops 6, 7a, 7b are short-circuited. They may be short-circuited via superconducting switches or through cooling the sheet 12 having good thermal conducting properties. If they are short-circuited e.g. before or during charging of the magnet coil 3, currents are induced into the conductor loops 6, 7a, 7b through charging of the magnet coil 3, which counteract the stray field of the magnet coil 3. Since the magnetic field generated by the magnet coil 3 can be very strong, high currents would flow in the conductor loops 6, 7a, 7b. The present invention therefore proposes short-circuiting the conductor loops 6, 7a, 7b only after charging of the magnet coil 3 such that the stray field of the magnet coil 3 can penetrate into the shielding or compensation coil arrangement 4. The currents flowing through the conductor loops 6, 7a, 7b are kept small such that the conductor loops can be produced from a very thin superconducting wire. Penetration of the stray field of the magnet coil 3 into the shielding or compensation coil arrangement 4 moreover prevents the stray field of the magnet coil 3 from deflecting and negatively influencing the main magnetic field, due to generation of high induction currents.

The inventive magnet system with the described shielding or compensation coil arrangement permits locally varying shielding of the disturbing field generated by a pulse tube cooler such that the excellent advantages of the pulse tube cooler are utilized during operation of an inventive magnet system.

LIST OF REFERENCE NUMERALS

1 cryostat
2 pulse tube cooler
3 magnet coil
4 shielding or compensation coil arrangement
5 regenerator housing
6 conductor loop with surface normals parallel to the cylinder axis
7 conductor loop with surface normals not parallel to the cylinder axis
8 symmetry axis
9 perforated sheet
10 bridges
11 recesses
12 sheet having good thermal conducting properties
13 wire which can be electrically heated
14 thermal insulating layer

We claim:

1. A magnet system of a magnetic resonance apparatus, the magnet system generating a magnetic field which is homogeneous and temporally highly stable within a volume under investigation and which extends along a z-axis, the magnet system comprising:
   a cryostat;
   a superconducting magnet coil disposed in said cryostat;
   a periodically operating refrigerator, said refrigerator having a magnetic regenerator material which is disposed in a regenerator housing within said cryostat in a stray field of said magnet coil; and
   means for shielding or compensating a magnetic disturbing field in the volume under investigation which is generated by periodic operation of said refrigerator due to changes in regenerator magnetization, said shield or compensating means comprising a compensation coil arrangement surrounding said regenerator housing, said compensation coil arrangement being structured and dimensioned for superconducting short-circuited operation thereof and comprising a plurality of conductor loops which are separately short-circuited during measurement to keep a plurality of magnetic fluxes through these conductor loops constant.

2. The magnet system of claim 1, wherein said regenerator housing has a cylindrical shape and at least part of said conductor loops are disposed along and about a cylinder axis.

3. The magnet system of claim 1, wherein said conductor loops form a three-dimensional cage which surrounds said regenerator housing, wherein surface normals of several conductor loops are not mutually parallel.

4. The magnet system of claim 1, wherein said conductor loops of said compensation coil arrangement can be closed and opened via one or more superconducting switches, which can be commonly heated.

5. The magnet system of claim 1, wherein one or both sides of said compensation coil arrangement is/are in contact with a sheet having good thermal conducting properties.

6. The magnet system of claim 5, wherein said sheet comprises copper.

7. The magnet system of claim 5, wherein said compensation coil arrangement and said sheet having good thermal conducting properties are thermally insulated from said regenerator housing and/or from a surrounding helium gas.

8. The magnet system of claim 1, wherein said refrigerator is a pulse tube cooler.

9. The magnet system of claim 1, wherein said regenerator material contains at least one of a substance with a magnetic phase transition of less than 30 K, ErNi, $Er_3Ni$, HoCu and $GdAlO_3$.

10. The magnet system of claim 1, wherein said compensation coil arrangement is a grid of superconductingly contacted, superconducting wires.

11. The magnet system of claim 10, wherein said wires comprise NbTi.

12. The magnet system of claim 1, wherein said compensation coil arrangement comprises a perforated sheet with superconducting bridges.

13. The magnet system of claim 12, wherein said bridges comprise NbTi.

14. The magnet system of claim 10, wherein said superconducting wires are thinner than 200 µm or thinner than 100 µm.

15. The magnet system of claim 1, wherein a section of said regenerator housing which contains said regenerator material is disposed at a location in said cryostat having minimum magnetic field during operation or is disposed radially outside of an outer partial shielding coil of said magnet coil.

16. A method for operating the magnet system of claim 1, the method comprising the steps of:
   a) opening all superconducting switches of said compensation coil arrangement;
   b) charging and short-circuiting said magnet coil, wherein a stray field thereof penetrates through said conductor loops; and
   c) closing the superconducting switches of said compensation coil arrangement to freeze fluxes through said conductor loops.

17. The method of claim 16, wherein said refrigerator is switched off during step c).

18. The method of claim 16, wherein, during step c), said regenerator material is at a temperature which is higher than an operating temperature to reduce a magnetization thereof.

* * * * *